United States Patent
Kamimura

(10) Patent No.: US 8,551,928 B2
(45) Date of Patent: Oct. 8, 2013

(54) MULTI-AGENT TYPE CLEANING KIT FOR SEMICONDUCTOR SUBSTRATES, CLEANING METHOD USING THE SAME AND METHOD OF PRODUCING SEMICONDUCTOR ELEMENT

(75) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 44 days.

(21) Appl. No.: 13/281,885

(22) Filed: Oct. 26, 2011

(65) Prior Publication Data

US 2012/0108485 A1    May 3, 2012

(30) Foreign Application Priority Data

Oct. 27, 2010  (JP) ................................. 2010-241082

(51) Int. Cl.
*C11D 3/10* (2006.01)
*C11D 3/00* (2006.01)

(52) U.S. Cl.
CPC .................................... *C11D 3/0052* (2013.01)
USPC .............................. 510/175; 510/176; 134/1.3

(58) Field of Classification Search
USPC ................... 510/175, 176; 134/1.3
See application file for complete search history.

(56) References Cited

U.S. PATENT DOCUMENTS

| 6,583,103 | B1 * | 6/2003 | Klinkhammer ................ 510/478 |
| 7,488,708 | B2 * | 2/2009 | Deljosevic et al. ............ 510/238 |
| 2004/0127381 | A1 * | 7/2004 | Scialla et al. .................. 510/372 |
| 2004/0147423 | A1 * | 7/2004 | Scialla et al. .................. 510/372 |
| 2006/0276366 | A1 * | 12/2006 | Deljosevic et al. ............ 510/302 |
| 2007/0029344 | A1 * | 2/2007 | Schymitzek et al. .......... 222/129 |
| 2007/0034229 | A1 | 2/2007 | Okuuchi et al. |
| 2010/0056411 | A1 | 3/2010 | Haraguchi et al. |

FOREIGN PATENT DOCUMENTS

| JP | 2004-311854 A | 11/2004 |
| JP | 2006-106616 A | 4/2006 |
| JP | 2007-517401 A | 6/2007 |
| JP | 4017402 B2 | 12/2007 |
| JP | 2010-132758 A | 6/2010 |
| KR | 10-2007-0018689 A | 2/2007 |
| WO | 2009/101575 A1 | 8/2009 |

OTHER PUBLICATIONS

Japanese Office Action dated Oct. 30, 2012, issued in corresponding Japanese Patent Application No. 2010-241082.
Korean Office Action with a mailing date of Aug. 6, 2013 for corresponding Korean Patent Application No. Oct. 2011-0109885 y.

* cited by examiner

*Primary Examiner* — Gregory Webb
(74) *Attorney, Agent, or Firm* — Sughrue Mion, PLLC

(57) ABSTRACT

A multi-agent type cleaning kit for applying to semiconductor substrates, which contains a foaming agent having an alkylene carbonate and a carbonic acid salt, a foaming aid having an acidic compound, and an oxidizing agent; at least the foaming agent is mixed with the foaming aid upon using for the cleaning of a semiconductor substrate, in combination with the oxidizing agent.

13 Claims, No Drawings

MULTI-AGENT TYPE CLEANING KIT FOR SEMICONDUCTOR SUBSTRATES, CLEANING METHOD USING THE SAME AND METHOD OF PRODUCING SEMICONDUCTOR ELEMENT

FIELD OF THE INVENTION

The present invention relates to a multi-agent type cleaning kit for semiconductor substrates, a cleaning method using the same, and a method of producing a semiconductor element.

BACKGROUND OF THE INVENTION

A process for the production of semiconductor elements (semiconductor devices) includes various steps such as a lithography step, an etching step, and an ion implantation step. After completion of each step, and before moving to the next step, a cleaning treatment is carried out, which is intended to detach and remove extraneous material (fouling) such as the resist residue remaining on the substrate surface or other impurities, and to clean the substrate surface.

As a conventional cleaning treatment method, a process of detaching and cleaning a resist residue, fine particles, metal and naturally-oxidized films using a mixed solution of concentrated sulfuric acid and hydrogen peroxide (hereinafter, appropriately referred to as SPM), has been frequently used. In this method, the ability to detach extraneous material is excellent; however, since the oxidizing power of the treatment liquid is too strong, there have been occasions where gate insulating films composed of a high dielectric constant (high-k) material or the like, or substrates themselves are damaged during the treatment. Considering the current circumstances that miniaturization of semiconductor devices is in progress, such damage, even a partial one, may cause deterioration of electrical properties. Furthermore, since the dangerousness of the chemical itself, the incidents of rapid temperature rise, and the like have been raised as an issue with regard to the method of using the SPM, this method is not necessarily a satisfactory method from the viewpoint of operation safety.

Accordingly, there is a demand for a cleaning technology which has less influence on the gate insulating films, substrates and the like, and is superior in terms of safety. As an example thereof, a method of cleaning an ashing residue using an aqueous solution containing ammonium carbonate and having a pH value of equal to or greater than 7 and less than 8.6, in a carbon dioxide gas atmosphere, has been suggested (Japanese Patent No. 4017402).

On the other hand, in recent years, there is a tendency with regard to the ion implantation process, which is one of the production processes for semiconductor elements, that the amount of ion implantation is increasing. In that case, because the resist to which ions have been implanted is carbonized and crosslinked, and thereby the outermost surface is altered, it is known that complete detachment may be difficult depending on the chemical. While there is an increasing demand for imparting higher reliability to semiconductor devices, it is considered more difficult to meet a demand for an improvement in the cleanliness of the substrate surface. Therefore, development of a cleaning liquid for a more efficient removal of impurities, including ion-implanted resists and the like such as described above, is desired.

The inventors of the present invention conducted an investigation on the detachability of ion-implanted resists and the like such as described above, using the cleaning liquid used in the cleaning method described in Japanese Patent No. 4017402. However, the inventors could not obtain results that are entirely satisfactory, and now, new improvements are needed.

SUMMARY OF THE INVENTION

The present invention addresses, under such circumstances, the provision of a multi-agent type cleaning kit for semiconductor substrates, which can suppress or prevent damage to gate insulating films or substrates, and can efficiently detach extraneous material such as impurities attached to the surface of a semiconductor substrate, particularly an ion-implanted resist, and has excellent safety; a method of cleaning using this cleaning agent; and a method of producing a semiconductor element.

The present invention resides, for the solution, in a multi-agent type cleaning kit for applying to semiconductor substrates, comprising:
 a foaming agent having an alkylene carbonate and a carbonic acid salt;
 a foaming aid having an acidic compound; and
 an oxidizing agent;
 at least the foaming agent being mixed with the foaming aid upon using for the cleaning of a semiconductor substrate, in combination with the oxidizing agent.

Further the present invention resides in a method of cleaning a semiconductor substrate and producing a semiconductor element, by using the multi-agent type cleaning kit.

Other and further features and advantages of the invention will appear more fully from the following description.

DETAILED DESCRIPTION OF THE INVENTION

According to the present invention, there is provided the following means:

(1) A multi-agent type cleaning kit for applying to semiconductor substrates, comprising:
 a foaming agent having an alkylene carbonate and a carbonic acid salt;
 a foaming aid having an acidic compound; and
 an oxidizing agent;
 at least the foaming agent being mixed with the foaming aid upon using for the cleaning of a semiconductor substrate, in combination with the oxidizing agent.

(2) The multi-agent type cleaning kit described in the above item (1), wherein the alkylene carbonate and/or the carbonic acid salt of the foaming agent is brought into reaction with the acidic compound of the foaming aid, by mixing the foaming agent and the foaming aid, so as to produce carbon dioxide gas for foaming.

(3) The multi-agent type cleaning kit described in the above item (1) or (2), further comprising a surfactant.

(4) The multi-agent type cleaning kit described in any one of the above items (1) to (3), wherein ethylene carbonate or propylene carbonate is used as the alkylene carbonate.

(5) The multi-agent type cleaning kit described in any one of the above items (1) to (4), wherein the surfactant is a nonionic surfactant.

(6) The multi-agent type cleaning kit described in any one of the above items (1) to (5), wherein the carbonic acid salt is a carbonic acid salt selected from the group consisting of ammonium carbonate, ammonium hydrogen carbonate, sodium hydrogen carbonate, sodium carbonate, potassium carbonate, potassium hydrogen carbonate, cesium carbonate, lanthanum carbonate, lithium carbonate, magnesium carbonate, manganese carbonate, nickel carbonate, strontium carbonate, aminoguanidine carbonate, and guanidine carbonate.

(7) The multi-agent type cleaning kit described in any one of the above items (1) to (6), wherein a concentration of the carbonic acid salt is 0.1% to 30% by mass relative to the total amount of the cleaning agent for semiconductor substrates obtained after mixing.

(8) The multi-agent type cleaning kit described in any one of the above items (1) to (7), wherein the acidic compound is a compound selected from the group consisting of sulfuric acid, nitric acid, boric acid, phosphoric acid, formic acid, acetic acid, propionic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, glycine, alanine, aspartic acid, glutamic acid, aminomethanesulfonic acid, taurine, benzenesulfonic acid, toluenesulfonic acid, methanesulfonic acid, ethanesulfonic acid, and sulfamic acid.

(9) The multi-agent type cleaning kit described in any one of the above items (1) to (8), wherein the oxidizing agent is a compound selected from the group consisting of hydrogen peroxide, nitrates, persulfates, bichromates, and permanganates.

(10) A method of cleaning a semiconductor substrate using a multi-agent type cleaning kit, comprising the steps of:
preparing a multi-agent type cleaning kit including at least a foaming agent and a foaming aid, the foaming agent having an alkylene carbonate and a carbonic acid salt, the foaming aid having an acidic compound;
providing an oxidizing agent to be contained at least in one of the foaming agent and the foaming aid; and
mixing the foaming agent and the foaming aid so as to produce carbon dioxide gas for foaming.

(11) A method of cleaning a semiconductor substrate using a multi-agent type cleaning kit, comprising the steps of:
preparing a multi-agent type cleaning kit including:
a foaming agent having an alkylene carbonate and a carbonic acid salt,
a foaming aid having an acidic compound, and
an agent containing an oxidizing agent,
mixing the foaming agent, the foaming aid, and the agent containing the oxidizing agent, so as to produce carbon dioxide gas for foaming.

(12) A method of producing a semiconductor element, the method comprising use of the cleaning method described in the above item (11) or (12) in the production of a semiconductor element.

The cleaning agent for semiconductor substrates of the present invention is a multi-agent type cleaning agent which contains at least a foaming agent and a foaming aid that are mixed at the time of use for the cleaning of a semiconductor substrate. The foaming agent contains an alkylene carbonate and a carbonic acid salt, while the foaming aid contains an acidic compound, and the cleaning agent is used in combination with an oxidizing agent. At this time, the oxidizing agent may be contained in advance into the foaming agent and/or the foaming aid, or may be mixed into the cleaning agent together with the foaming agent and the foaming aid. By employing such a constitution of invention, the carbon-dioxide-foaming component of the foaming agent reacts with the acidic compound in the foaming aid, thereby carbon dioxide gas ($CO_2$) is generated, and foaming occurs. This foaming physically works, preferably to detach and remove any impurities (extraneous material) attached to the substrate surface while destroying them, so that the present invention exhibits a characteristic cleaning mechanism which is different from that of conventional SPM's. Hereinafter, preferred embodiments of the present invention will be described in detail.

<Foaming Agent: First Agent>

(Carbonic Acid Salt)

The foaming agent that constitutes the cleaning agent for semiconductor substrates of the present invention contains a carbonic acid salt. The carbonic acid salt is a compound generating carbon dioxide under the action of an acid compound that will be described below, and acts as a so-called degradable foaming agent.

There are no particular limitations on the carbonic acid salt that can be used, as long as it is a salt compound generating carbon dioxide, but a normal salt, an acidic salt (hydrogen carbonate), a basic salt (hydroxide carbonate) and the like may be mainly used. Examples include carbonic acid salts and hydrogen carbonates of alkali metals or alkaline earth metals, and ammonium carbonate salts. More specific examples include, as carbonic acid salts, ammonium carbonate, ammonium hydrogen carbonate, sodium hydrogen carbonate, sodium carbonate, potassium carbonate, potassium hydrogen carbonate, cesium carbonate, lanthanum carbonate, lithium carbonate, magnesium carbonate, manganese carbonate, nickel carbonate, strontium carbonate, aminoguanidine carbonate, and guanidine carbonate. Furthermore, anhydrous salts, hydrated salts, and mixtures thereof can also be used. Among them, ammonium hydrogen carbonate or ammonium carbonate is preferable from the viewpoint that these salts have an excellent ability to detach extraneous material and are easy to handle, and the ammonium carbonate is more preferable. The carbonic acid salt may be used singly, or two or more kinds may be used in combination.

There are no particular limitations on the content of the carbonic acid salt in the foaming agent, but in consideration of excellent detachability of extraneous material, the content is preferably 0.1% to 80% by mass, and more preferably 0.5% to 50% by mass, relative to the total amount of the foaming agent. In addition, the content of the carbonic acid salt in the mixture of the foaming agent and the foaming aid that will be described later is preferably 0.1% to 30% by mass, and more preferably 0.5% to 30% by mass, relative to the total amount of the mixed liquid, in consideration of excellent detachability of extraneous material.

(Solvent)

In the cleaning agent for semiconductor substrates of the present invention, an alkylene carbonate is used as the solvent for the foaming agent (first agent). Examples of the alkylene carbonate contain ethylene carbonate and propylene carbonate, and among them, it is preferable to use ethylene carbonate. When the alkylene carbonate is solidified at the storage temperature, this compound can be used as a suitable solvent by warming it to melt. This alkylene carbonate not only functions as a solvent to dissolve the carbonic acid salt, but can also function as a foaming component per se in the foaming agent. That is to say, the alkylene carbonate reacts with the acidic compound in the foaming aid that will be described below, thereby foaming carbon dioxide, and destroys extraneous material in conjunction with foaming from the carbonic acid salt. Thus, the cleaning agent can exhibit a further enhanced cleaning action. The solvent may contain water, and if the solvent contains water, the content of water is preferably in the range of 0.05 to 50 parts by mass, and more preferably in the range of 1 to 30 parts by mass, relative to 100 parts by mass of the alkylene carbonate. This additional water is added when dissolution of the carbonic acid salt is insufficient when the alkylene carbonate is used alone, and is preferably added in an amount sufficient to dissolve the salt. As another additional solvent, the solvent may contain an organic solvent (for example, dimethylsulfoxide (DMSO), dimethylformamide (DMF), and N-methylpyrrolidone (NMP), which are polar solvents).

The content of the solvent is not particularly limited, but usually, the content is preferably 1% to 99.5% by mass, and more preferably 10% to 99.0% by mass, relative to the total amount of the foaming agent.

When the foaming agent (first agent) contains water and can be evaluated on the basis of pH, although there are no particular limitations, the foaming agent preferably has a pH value of 7.5 or greater, and more preferably 8.0 or greater. The upper limit is not particularly limited, but it is preferably 12.0 or less, and more preferably 11.0 or less.

<Foaming Aid: Second Agent>
(Acidic Compound)

The foaming aid constituting the multi-agent type cleaning agent for semiconductor substrates of the present embodiment contains an acidic compound.

The acidic compound means a compound which exhibits acidity per se, or exhibits acidity when converted into an aqueous solution. This compound acts on the carbonic acid salt described above and generates carbon dioxide gas, and at the same time, the acidic compound itself exhibits a cleaning action, thereby contributing to the detachability of extraneous material. In addition, without being limited to this acidic compound, the term "compound" as used in the present specification is used to mean the said compound itself as well as a salt thereof and an ion thereof. Typically, the term "compound" means the said compound and/or a salt thereof.

There are no particular limitations on the acidic compound to be used, but examples include sulfuric acid, nitric acid, boric acid, phosphoric acid, formic acid, acetic acid, propionic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, glycine, alanine, aspartic acid, glutamic acid, aminomethanesulfonic acid, taurine, benzenesulfonic acid, toluenesulfonic acid, methanesulfonic acid, ethanesulfonic acid, sulfamic acid, and ascorbic acid. The acidic compound may be used singly, or two or more kinds may be used in combination.

Among them, a water-soluble organic acid is preferred from the viewpoint of being inexpensive and easy to handle. As a more preferred embodiment, a water-soluble carboxylic acid having a carboxylic acid group may be used. As a preferred example of the water-soluble carboxylic acid, a water-soluble aliphatic carboxylic acid is exemplified. As a more preferred example thereof, a water-soluble aliphatic carboxylic acid having 1 to 6 carbon atoms is exemplified. Particularly preferred examples include aliphatic mono-, di- and tricarboxylic acids having 2 to 6 carbon atoms, each of which may have 1 to 5 hydroxyl groups.

Specific examples of the water-soluble carboxylic acid include monocarboxylic acids such as propionic acid, lactic acid, gluconic acid and glucuronic acid; dicarboxylic acids such as oxalic acid, malonic acid, succinic acid, malic acid, tartaric acid, phthalic acid and maleic acid; and tricarboxylic acids such as citric acid.

The content of the acidic compound in the foaming aid is not particularly limited, but in consideration of excellent detachability of extraneous material, the content is preferably 0.01% to 50% by mass, more preferably 1% to 50% by mass, and particularly preferably 1% to 25% by mass, relative to the total mass of the foaming aid. In addition, the content of the acidic compound in the mixture of the foaming agent and the foaming aid that will be described below is preferably 0.01% to 30% by mass, and more preferably 0.01% to 10% by mass, relative to the total amount of the mixed liquid, in consideration of excellent detachability of extraneous material.

(Solvent)

The foaming aid may contain a solvent as necessary. There are no particular limitations on the solvent to be used as long as the acidic compound is dissoluble therein, but usually, water is used. Furthermore, the foaming aid may also contain an organic solvent (for example, DMSO, DMF and NMP, which are polar solvents) to the extent that the effects of the present invention are not impaired. The content of the solvent in the foaming aid is not particularly limited, but usually, the content is preferably 1% to 99.5% by mass, and more preferably 10% to 99.0% by mass, relative to the total amount of the foaming aid.

The pH of the foaming aid is not particularly limited, but in consideration of superior safety and detachability of extraneous material, the pH is preferably less than 7.5, and more preferably 5.0 or less. Furthermore, the lower limit is not particularly limited, but is preferably 0 or greater.

<Oxidizing Agent>

The foaming agent and/or the foaming aid may contain an oxidizing agent. By containing an oxidizing agent in the foaming agent and/or the foaming aid, the detachability of extraneous material is further improved. Particularly, in the present invention, a higher cleaning effect can be obtained as a result of the cleaning action exhibited by the oxidizing agent, in conjunction with the detachment of extraneous material brought by the foaming of the foaming agent. There are no particular limitations on the oxidizing agent to be used, but examples include peroxides (for example, hydrogen peroxide), nitrates, persulfates, bichromates, and permanganates. Among them, hydrogen peroxide is preferred from the viewpoint that these compounds have an excellent ability to detach extraneous material and are easy to handle.

The content of the oxidizing agent contained in the foaming agent or the foaming aid is not particularly limited, and in consideration of excellent detachability of extraneous material, the content is preferably 0.01% to 20% by mass, and more preferably 0.1% to 20% by mass, relative to the total amount of each component. Furthermore, the content of the oxidizing agent contained in the mixed liquid of the foaming agent and the foaming aid is not particularly limited, but in consideration of excellent detachability of extraneous material, the content is preferably 0.005% to 10% by mass, and more preferably 0.05% to 10% by mass, relative to the total amount of the mixed liquid.

In addition, the use of the oxidizing agent in the present invention is not limited to the embodiment in which the oxidizing agent is used as contained in the foaming agent or the foaming aid, and the oxidizing agent or a preparation containing the oxidizing agent may be combined with the foaming agent and the foaming aid, and mixed with them at the time of cleaning. The same also applies to the optional components that will be described later.

<pH>

According to the present embodiment, foaming can be accelerated by containing a carbon-dioxide-foaming component into the foaming agent and allowing the carbon-dioxide-foaming component to react with the acidic compound in the foaming aid. When the reaction occurring at this time is organized under an assumption that the foaming agent (first agent) is also composed of a water medium, and is summarized on the basis of pH, the reaction system can be illustrated as follows. The pKa of the carbonic acid salt is 6.3 to 6.5 (pKa1), and 10.2 to 10.4 (pKa2), and the corresponding reactions are respectively represented by the following formulae.

$$CO_3^{2-} + H^+ \rightarrow HCO_3^- \qquad (1)\ pKa2$$

$$HCO_3^- + H^+ \rightarrow H_2CO_3 \qquad (2)\ pKa1$$

Furthermore, as shown by formula (2), carbon dioxide gas is generated through the reaction of $H_2CO_3 \rightarrow H_2O + CO_2$ (g)↑. In general, the term pKa represents the pH at which the chemical species on the both sides of the chemical reaction formula exists at the ratio of 1:1. Further, when the pH value is different from the pKa value by 1, it is known to mean that the existing ratio of the chemical species on the right-hand side and the left-hand side differ by 10 times. In regard to the above formula (2), it means that at pH=6.3 to 6.5, $HCO_3^-$ and $H_2CO_3$ are present in equal amounts; at pH=5.3 to 5.5 (pKa1−1), $HCO_3^-$ and $H_2CO_3$ are present at the ratio of 1:10; and at pH=7.3 to 7.5 (pKa1+1), $HCO_3^-$ and $H_2CO_3$ are present at the ratio of 10:1. When the factor of the presence of a carbonic acid salt that contributes to foaming is added, the expected foaming reaction may not easily occur effectively at pH of 7.5 or higher.

Hereinafter, the optional components constituting the multi-agent type cleaning agent for semiconductor substrates of the present invention will be described in detail. The materials that will be described below in detail may be obtained from commercially available products, or may be synthesized by known methods.

<Surfactant>

The foaming agent and/or the foaming aid may contain a surfactant. When a surfactant is contained, the size of the foam produced by the carbon dioxide gas that is generated from the mixed liquid of the foaming agent and the foaming aid that will be described below is more controlled, and as a result, the capability to detach extraneous material such as resist is improved.

There are no particular limitations on the surfactant to be used, but examples thereof include a cationic surfactant, an amphoteric surfactant, an anionic surfactant, and a nonionic surfactant. Particularly, from the viewpoint of having an excellent capability to detach extraneous material and to suppress the re-attachment of the impurities once detached from the substrate surface to the substrate surface, a nonionic surfactant or an anionic surfactant is more preferable, and in consideration of obtaining superior effect of the present invention, a nonionic surfactant is particularly preferable. Furthermore, surfactants having linear structures and branched structures can both be used.

Examples of the cationic surfactant include tetraalkylammonium salts, alkylamine salts, benzalkonium salts, alkylpyridium salts, and imidazolium salts.

Examples of the anionic surfactant include sodium dodecyl benzenesulfonate, sodium lauryl sulfate, sodium alkyldiphenyl ether disulfonate, and sodium alkyl naphthalenesulfonate.

Examples of the amphoteric surfactant include carboxybetaine, sulfobetaine, aminocarboxylic acid salts, and imidazoline derivatives.

Examples of the nonionic surfactant include polyoxyethylene alkyl ether, polyoxyethylene alkyl phenyl ether, polyoxyethylene fatty acid ester, sorbitan fatty acid ester, polyoxyethylene sorbitan fatty acid ester, polyoxyethylene sorbitol fatty acid ester, glycerin fatty acid ester, polyoxyethylene glycerin fatty acid ester, polyglycerin fatty acid ester, sucrose fatty acid ester, polyoxyethylene alkylamine, polyoxyethylene fatty acid amide, alkylalkanolamide, acetylene glycol, and polyoxyethylene adducts of acetylene glycol. Other examples include polyoxypropylene-based compounds in which the oxyethylene structure of the compounds exemplified above is replaced with an oxypropylene structure.

Among them, a polyoxyalkylene type nonionic surfactant is preferred in consideration of excellent detachability of extraneous material. Specific examples thereof include polyoxyalkylene alkyl ether, polyoxyalkylene alkyl phenyl ether, polyoxyalkylene glycol fatty acid ester, polyoxyalkylene fatty acid ester, polyoxyalkylene sorbitan fatty acid ester, polyoxyalkylene fatty acid monoalkanolamide, and polyoxyalkylene fatty acid dialkanolamide. More specific examples include surfactants in which the alkylene moiety is ethylene or propylene.

Furthermore, as a preferred embodiment of the polyoxyalkylene type nonionic surfactant, a polyoxyalkylene type nonionic surfactant represented by the following formula (1) is preferred.

$$R^2O\text{—}(R^1O)_p\text{—}H \qquad \text{Formula (1)}$$

In formula (1), $R^1$ represents an ethylene group or a propylene group, and p represents an integer of 2 or greater (preferably an integer of 30 or less, and more preferably 10 or less). Plural $R^1$'s may be the same as or different from each other.

$R^2$ represents a hydrogen atom or an alkyl group (preferably having 1 to 20 carbon atoms), and in consideration of obtaining superior effect of the present invention, a hydrogen atom is preferred. Here, the alkyl group may have a substituent such as an amino group, but it is preferable that the alkyl group does not contain a phenyl group as a substituent.

As a preferred embodiment of the surfactant represented by formula (1), polyoxyalkylene type nonionic surfactants represented by the following formula (2) or formula (3) are exemplified.

$$HO\text{-}(EO)_x\text{—}(PO)_y\text{—}(EO)_z\text{—}H \qquad \text{Formula (2)}$$

$$HO\text{—}(PO)_x\text{-}(EO)_y\text{—}(PO)_z\text{—}H \qquad \text{Formula (3)}$$

In formula (2) and formula (3), EO represents an oxyethylene group, and PO represents an oxypropylene group. x, y and z each independently represent an integer of 1 or greater (preferably an integer of 10 or less).

Examples of nonionic surfactants are shown as follows, but the present invention is not limited by these examples.

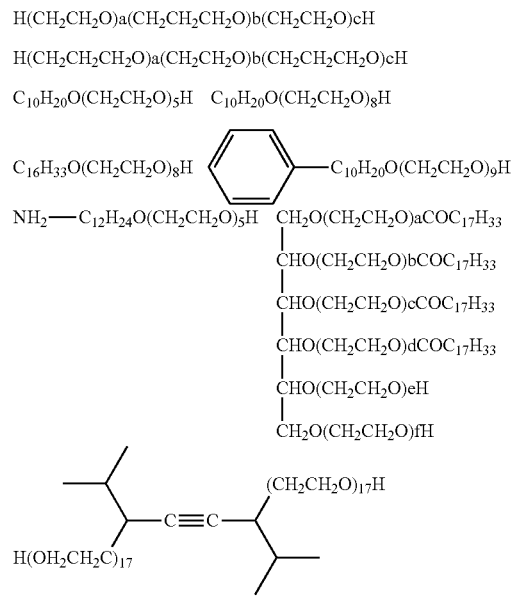

The content of the surfactant contained in the foaming agent or the foaming aid is not particularly limited, but in consideration of excellent detachability of extraneous material, the content is preferably 0.0001% to 10% by mass, and more preferably 0.001% to 1% by mass, relative to the total amount of the various agents. In addition, the content of the surfactant in the mixed liquid of the foaming agent and the foaming aid is not particularly limited, but in consideration of excellent detachability of extraneous material, the content is preferably 0.00005% to 5% by mass, and more preferably 0.0005% to 0.5% by mass, relative to the total amount of the mixed liquid.

<Alkaline Compound>

The foaming agent may contain an alkaline compound. By containing an alkaline compound in the foaming agent, the adjustment of pH is facilitated, and stabilized foaming in the mixed liquid is achieved, so that the detachability of extraneous material is further improved.

There are no particular limitations on the alkaline compound to be used, but examples include tetramethylammonium hydroxide, tetraethylammonium hydroxide, tetrapropylammonium hydroxide, and tetrabutylammonium hydroxide. The content of the alkaline compound in the foaming agent is not particularly limited, and it is preferable to use the alkaline compound so as to obtain the pH described above. Specifically, the content is preferably 0.0001% to 10% by mass, and more preferably 0.0001% to 5% by mass, relative to the total amount of the foaming agent.

<Multi-Agent Type Cleaning Agent for Semiconductor Substrate>

The multi-agent type cleaning agent for semiconductor substrates of the present invention contains at least a foaming agent and a foaming aid, and the two agents are mixed before use at the time of cleaning a semiconductor substrate. The pH of the mixed liquid is preferably adjusted to be lower than 7.5. When the pH of the mixed liquid is lower than 7.5, foaming of carbon dioxide gas occurs sufficiently, and the detachability of extraneous material is sufficiently increased, which is preferable. The pH of the mixed liquid is preferably lower than 7.0, and more preferably 6.5 or lower, and is preferably 2.0 or higher, and more preferably 3.5 or higher, in consideration of excellent detachability of extraneous material. Furthermore, although there are instances where the pH of the mixed liquid varies along with foaming, it is preferable that the mixed liquid maintain the pH within the range described above throughout the cleaning treatment. In addition, unless particularly stated otherwise in terms of the measurement temperature or the like, the pH as used in the present specification means a value measured at room temperature (23° C.), using F-51 (product name) manufactured by HORIBA, Ltd.

The mixing mass ratio of the foaming agent and the foaming aid (foaming agent/foaming aid) is not particularly limited as long as the pH of the mixed liquid falls within the range described above. However, from the viewpoint of handleability or the like, the mixing mass ratio is preferably in the range of 0.01 to 100.

<Cleaning Method>

The method of cleaning a semiconductor substrate using the multi-agent type cleaning agent for semiconductor substrates of the present invention is not particularly limited, but a method of supplying at least the foaming agent and the foaming aid onto a semiconductor substrate, and cleaning the semiconductor substrate in a mixed liquid of the foaming agent and the foaming aid, which exhibits a pH value of less than 7.5, is preferred. Generally, since the resist (photoresist) is carbonized after ion implantation, it is difficult to detach and remove the resist with chemicals. However, by using the cleaning agent as described above, a carbonized resist residue can be easily detached and removed from the semiconductor substrate.

In a general method of producing semiconductor elements, first, a gate insulating film composed of a high dielectric constant material (for example, $HfSiO_4$, $ZiO_2$, $ZiSiO_4$, $Al_2O_3$, $HfO_2$, and $La_2O_3$) or the like, or a gate electrode layer composed of a polysilicon or the like is formed on a silicon substrate (for example, an ion-implanted, n-type or p-type silicon substrate) using a technique such as sputtering (a to-be-etched layer forming step). Subsequently, a resist is applied on the gate insulating film or the gate electrode layer thus formed, and a predetermined pattern is formed thereon by photolithography. After the pattern is formed, the resist of unnecessary parts is developed and removed (resist developing step), and using this resist pattern as a mask, the non-masked regions are dry etched or wet etched (etching step), to thereby remove the gate insulating film or the gate electrode layer. Thereafter, an ion implantation treatment (ion implantation step) is carried out, in which an ionized, p-type or n-type impurity element is implanted to the silicon substrate, and thus a p-type or n-type impurity-implanted region (so-called source/drain region) is formed on the silicon substrate. Subsequently, if necessary, an ashing treatment (ashing step) is carried out, and then a treatment to detach any resist film remaining on the substrate is carried out.

The cleaning method using the cleaning agent for semiconductor substrates of the present invention is a method carried out during the production of a semiconductor element, and the cleaning method may be carried out subsequent to any step. Specifically, for example, the cleaning method can be carried out after development of the resist, after dry etching, after wet etching, after ashing, after ion implantation, or the like. Particularly, in consideration of excellent detachability of the resist that has been carbonized by ion implantation, it is preferable that the cleaning method is carried out after the ion implantation step.

More specifically, it is preferable to apply the cleaning agent of the present invention to a semiconductor substrate which is obtained through a step of preparing a semiconductor substrate (for example, a p-type or n-type silicon substrate) on which a to-be-etched layer (a gate insulating film and/or a gate electrode layer) is formed on the surface (to-be-etched layer forming step); a step of forming a photoresist pattern on top of the to-be-etched layer (resist forming step); a step of selectively etching the to-be-etched layer using the photoresist pattern as an etching mask (etching step); and a step of performing ion implantation (ion implantation step).

Furthermore, the ion implantation step can be carried out by a known method, and the step can be carried out using ions of argon, carbon, neon, arsenic, or the like, at a dose amount of $10^{15}$ to $10^{18}$ atoms/cm$^2$.

As another suitable embodiment of the cleaning method of the present invention, there may be mentioned a method of carrying out the ion implantation step as described above, subsequently further subjecting the substrate to an ashing treatment, or to the removal of any bulky debris on the substrate or removal of a bulk layer, using a general-purpose cleaning liquid, and then subjecting the cleaning method of using the cleaning agent of the present invention, to any debris that is difficult to remove or various layers.

When the method of cleaning using the cleaning agent of the present invention is carried out after performing an ashing treatment as described above, the cleaning agent brings a sufficient cleaning effect even if no oxidizing agent is contained in the foaming agent and the foaming aid. If no oxidizing agent is used in the cleaning method, generation of an oxide film on the substrate is consequently further suppressed, which is preferable. The ashing treatment can be carried out by a well known technique, and for example, a technique of using a plasma gas or the like may be used.

Furthermore, the cleaning method described above may be carried out repeatedly on the same substrate. For example, when a treatment of performing the cleaning two or more times (for example, two times, or three times) is carried out, there may be obtained a cleaning effect more than the effect when the cleaning treatment was performed once.

In a preferred embodiment of the cleaning method using the cleaning agent of the present invention, the foaming agent and the foaming aid are supplied onto a semiconductor substrate. The method of supplying is not particularly limited, but the foaming agent and the foaming aid may be simultaneously supplied onto the semiconductor substrate (embodiment A). Further, the foaming agent may be first supplied onto the semiconductor substrate, and then the foaming aid may be supplied after a lapse of a predetermined time period (embodiment B). Furthermore, the foaming aid may be first supplied onto the semiconductor substrate, and then the foaming agent may be supplied after a lapse of a predetermined time period (embodiment C). In this case, it is not meant to inhibit other functional agents from being supplied simultaneously or sequentially. In consideration of such embodiments as described above, the cleaning agent of the present invention may also be prepared as a multi-agent type cleaning kit which combines a foaming agent, a foaming aid, and if necessary, other agents.

In consideration of excellent detachability of extraneous material, it is preferable to immerse the semiconductor substrate in any one of the foaming agent and the foaming aid for a predetermined time period, and to subsequently add the other agent to the immersion bath (embodiment B or C). Particularly, from the viewpoints of having a superior ability to detach extraneous material and further superior effects to reduce damage to the substrate, the gate insulating film or the like, it is preferable to immerse the semiconductor substrate in the foaming agent, and to subsequently add the foaming aid to the immersion bath (embodiment C). By immersing the semiconductor substrate in the foaming agent for a predetermined time period, the carbonic acid salt adheres to the periphery of the extraneous material, and thereby the carbon dioxide gas generated therefrom efficiently contributes to the detachment and removal of the extraneous material.

The time for immersing the semiconductor substrate in the foaming agent or the foaming aid is not particularly limited. However, as the immersion time is increased, more of the contained components adhere to the periphery of extraneous material such as a resist residue on the semiconductor substrate, and the efficiency of the removal of the extraneous material is enhanced. From the view point of enhancing of detachability of the extraneous material, the immersion time is preferably 10 seconds or longer, and more preferably 30 seconds or longer. In addition, since the productivity and the effect finally become saturated, the immersion time is preferably no longer than 30 minutes.

The temperature of the foaming agent or the foaming aid at the time of immersion is not particularly limited, but in consideration of excellent detachability of extraneous material as well as achievement of stabilized foaming, a temperature of 25° C. to 80° C. is preferred.

In the case of adding, to any one of the foaming agent and the foaming aid in which a semiconductor substrate is immersed, the other one of the foaming agent and the foaming aid that was not chosen, and thereby preparing a mixed liquid, the method of adding the component (the foaming agent or the foaming aid) may be carried out by adding the entire amount at the same time, or by adding in divided portions.

Furthermore, in the cleaning method described above, a component other than the foaming agent and the foaming aid (for example, deionized water) may also be concurrently added to the extent that the effect of the present invention is not impaired.

The temperature of the mixed liquid of the foaming agent and the foaming aid (treatment temperature) is not particularly limited, but from the viewpoint of excellent detachability of extraneous material and further reducing of damage to the substrate, the gate insulating film or the like, it is preferable to control the temperature to 25° C. to 80° C., and more preferably to 30° C. to 75° C. When the temperature of the mixed liquid is too high, foaming of the carbon dioxide gas occurs instantaneously, so that the detachability of the extraneous material and handleability may be impaired. When the temperature of the mixed liquid is too low, more time may be required for the removal of the extraneous material.

When the foaming aid (or the foaming agent) is added to the foaming agent (or the foaming aid) in which a semiconductor substrate is immersed as described above, it is more preferable to control the rate of addition such that the temperature of the mixed liquid remains in the range described above.

After the foaming agent and the foaming aid are mixed, if necessary, the semiconductor substrate may be kept immersed in the mixed liquid for a predetermined time. The immersion time is not particularly limited, but from the viewpoint of productivity or the like, the immersion time is preferably 10 seconds to 5 minutes, and more preferably 30 seconds to 3 minutes. While the semiconductor substrate is kept immersed in the mixed liquid, the mixed liquid may be stirred, if necessary.

After completion of the treatment, the semiconductor substrate may be pulled out from the mixed liquid and subjected to a treatment of cleaning the surface using water or the like (cleaning step), if necessary.

<Semiconductor Substrate>

For the semiconductor substrate (substrate for semiconductor elements), which is the object to be cleaned by the cleaning treatment described above, any semiconductor substrate of any stage in the production process described above can be used. A suitable example of the object to be cleaned may be a semiconductor substrate having a resist (particularly, a resist that has been subjected to ion implantation) on the surface. Furthermore, when the cleaning agent of the present invention is used, the resist (or the patterned resist), as well as the residue generated at the time of ashing (ashing residue), the residue generated at the time of etching (etching residue), and other impurities can be detached and removed from the substrate having these substances on the surface.

The semiconductor substrate used in the present invention may have, in addition to the resist, an insulating film such as a silicon oxide film or a silicon nitride film, or a layer of a tantalum nitride (TaN) layer, a titanium nitride (TiN) layer, a hafnium oxide ($HfO_2$) layer, a lanthanum oxide ($La_2O_3$) layer, an aluminum oxide ($Al_2O_3$) layer, a polysilicon, doped (argon, carbon, neon, arsenic, and the like) silicon or the like, on a part or the entirety of the surface.

The term semiconductor substrate as used in the present specification is used as a collective name for intermediates (precursors) used in the production of semiconductor elements. Thus, the semiconductor substrate means to include a silicon wafer as well as intermediate products prior to mounting, in which an insulating film, electrodes and the like have been attached on a silicon wafer.

As the resist that is deposited on the semiconductor substrate to be used, any known resist material can be used, and examples thereof include a positive type photoresist, a negative type photoresist, and a positive-negative combined type photoresist. Specific examples of the positive type resist include a vinyl cinnamate-based resist, a cyclized polyisobutylene-based resist, an azo-novolac resin-based resist, and a diazoketone-novolac resin-based resist. Specific examples of the negative type resist include an azide-cyclized polyisoprene-based resist, an azide-phenol resin-based resist, and a chloromethyl-polystyrene-based resist. Furthermore, specific examples of the positive-negative combined type resist include a poly(p-butoxycarbonyloxystyrene)-based resist.

By employing the cleaning method using the cleaning agent for semiconductor substrates of the present invention, extraneous material such as an ion-implanted resist, which may be difficult to detach and remove with conventional chemicals, can be detached and removed from the surface of the semiconductor substrate. That is to say, the cleaning agent for semiconductor substrates of the present invention can be suitably used as a treatment agent for resist detachment, which is intended for the detachment and removal of any resist remaining on the semiconductor substrate.

Furthermore, according to the cleaning method of the present invention, the effect of corrosion or the like on the semiconductor substrate itself (for example, a silicon substrate), a metal wiring of aluminum or the like which is deposited on the surface of the semiconductor substrate, or a gate insulating film such as a titanium nitride (TiN) layer, a hafnium oxide ($HfO_2$) layer or a lanthanum oxide ($La_2O_3$) layer can be suppressed, unlike the case of using an SPM solution, which is a conventional cleaning chemical.

It is preferable that the cleaning step, which is carried out in the cleaning method using the cleaning agent of the present invention as described above, is included in the method of producing a semiconductor element. Specifically, the method is a method of producing a semiconductor element, which includes a cleaning step using the foaming agent and the foaming aid described above. This cleaning method can also be used in the cleaning of a semiconductor substrate having a very fine wiring width, to which conventional cleaning agents are not applicable, and also, damage to high-k films and the like is also small. Therefore, the cleaning method of the present invention can be suitably used for the production of smaller-sized, high performance electronic parts for liquid crystal displays, memory chips, central processing units, and the like. The cleaning method can also be suitably used in the production of semiconductor substrates using a porous material that is susceptible to damage, such as an ultra-low-k material, development of which is in progress as a next generation insulating film.

The multi-agent type cleaning kit for semiconductor substrates of the present invention can suppress or prevent damage to gate insulating films or substrates, and also can efficiently detach extraneous material such as impurities attached to the surface of a semiconductor substrate, particularly an ion-implanted resist, and has excellent safety.

The present invention will be described in more detail based on examples given below, but the invention is not meant to be limited by these examples.

EXAMPLES

Preparation of Semiconductor Substrate Sample

An $Al_2O_3$ layer, a TiN layer, a $HfO_2$ layer, and a 40% SiGe layer were respectively formed on silicon wafers to a thickness of 100 Å, and thus four types of wafers were prepared.

Example and Comparative Example

The cleaning agent components indicated in the following Tables 1 to 8 were used, and the effects of the cleaning agent on the resist detachability and on the substrate were evaluated. First, one of the semiconductor substrate samples prepared as described above, or an untreated silicon wafer was immersed in the cleaning agent for a predetermined time period (5 minutes). Subsequently, the substrate was pulled out and was subjected to evaluations described below. The treatment temperature indicated in Tables 1 to 8 means the temperature within the cleaning agent (mixed liquid).

<Detachability of Resist>

The detachability of the resist was evaluated according to the following criteria. For practical purposes, the grade higher than C is necessary.

In the substrate surface (area: 3.0×3.0 μm) observed with a microscope:

AAA: The area in which the resist is remaining behind is less than 5%.

AA: The area in which the resist is remaining behind is equal to or larger than 5% and less than 10%.

A: The area in which the resist is remaining behind is equal to or larger than 10% and less than 30%.

B: The area in which the resist is remaining behind is equal to or larger than 30% and less than 50%.

B': The area in which the resist is remaining behind is equal to or larger than 50% and less than 80%.

C: The area in which the resist is remaining behind is equal to or larger than 80%.

The term "bulk layer removal" means a resist obtained as a result of a 0-degree implantation treatment of As ions into a KrF resist under the conditions where implantation energy of 5 keV and dose amount of $10^{15}$ atoms/$cm^2$ (a resist having almost none of a hardened layer (crust part) or an altered layer).

The term "hardened layer removal" means a resist obtained as a result of a 45-degree implantation treatment of As ions into a KrF resist under the conditions where implantation energy of 5 keV and dose amount of $10^{15}$ atoms/$cm^2$ (a resist having a hardened layer or an altered layer extensively produced thereon).

[Etching Rate (ER)]

Each of the cleaning liquids was used, and the etching rate (ER) to each film was calculated from the difference in the film thickness before and after the treatment. For practical purposes, the etching rate is preferably less than 50 Å/min, and more preferably less than 10 Å/min.

[Doped Si-Loss]

This is a value (Å) obtained by measuring the loss of thickness (the thickness shaved by cleaning) on the wafer surface in the case of using an untreated silicon wafer in the Examples, by ICP-MS (an inductively coupled plasma mass spectrometer, manufactured by SHIMADZU CORPORATION), and then calculated in terms of the film thickness. For practical purposes, the value is preferably less than 10 Å.

[Ox Growth]

This is a value (nm) obtained by measuring the thickness of a silicon oxide layer formed on the wafer surface in the case of using an untreated silicon wafer in the Examples, by ellipsometry (VASE, manufactured by J.A. Woollam Co.). For practical purposes, the value is preferably less than 10 Å.

The concentrations of the aqueous solutions shown in the following tables are as follows.

Concentration of sulfuric acid: 98 mass %
Concentration of aqueous hydrogen peroxide: 30 mass %
Concentration of an aqueous solution of an organic acid: 20 mass %

In regard to the mixing mode of various agents, the first agent in the second column and the second agent in the third column in the tables were separately prepared, and the first agent and the second agent were mixed to prepare a cleaning agent (two-agent type). Specifically, it is implied that in Example 1, the first agent containing ammonium carbonate, tetramethylammonium hydroxide (TMAH), surfactant, and aqueous hydrogen peroxide, and the second agent containing citric acid and deionized water were separately prepared, and the two agents were mixed before use at the time of cleaning.

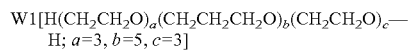

W1[H(CH$_2$CH$_2$O)$_a$(CH$_2$CH$_2$CH$_2$O)$_b$(CH$_2$CH$_2$O)$_c$—H; $a$=3, $b$=5, $c$=3]

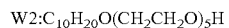

W2:C$_{10}$H$_{20}$O(CH$_2$CH$_2$O)$_5$H

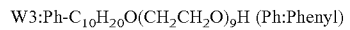

W3:Ph-C$_{10}$H$_{20}$O(CH$_2$CH$_2$O)$_9$H (Ph:Phenyl)

The tables shown below present the results organized as follows, based on Test No. 101. Table 1 presents the results obtained by varying the type of the acidic compound; Table 2 presents the results obtained by varying the type of the carbonic acid salt; Table 3 presents the results obtained by varying the amount of the carbonic acid salt; Table 4 presents the results obtained by varying the amount of ethylene carbonate; Table 5 presents the results obtained by varying the amount of the acidic compound; Table 6 presents the results obtained by varying the amount of the oxidizing agent; and Tables 7 and 8 present the results obtained by applying optional additives such as a surfactant.

TABLE 1

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| S11 (Reference Example) | Ammonium carbonate (10) TMAH (1.25) Deionized water (88.75) Surfactant W1 (1) 30% Hydrogen peroxide (50) | Citric acid (20) Deionized water (80) | 70 | C | B |
| 101 (This invention) | Ammonium carbonate (10) Deionized water (15) Ethylene carbonate (75) 30% Hydrogen peroxide (50) | Citric acid (20) Deionized water (80) | 70 | B | B |
| 102 (This invention) | Ammonium carbonate (10) Deionized water (15) Ethylene carbonate (75) 30% Hydrogen peroxide (50) | Sulfuric acid (20) Deionized water (80) | 70 | B | B |
| 103 (This invention) | Ammonium carbonate (10) Deionized water (15) Ethylene carbonate (75) 30% Hydrogen peroxide (50) | Acetic acid (20) Deionized water (80) | 70 | B | B |
| 104 (This invention) | Ammonium carbonate (10) Deionized water (15) Ethylene carbonate (75) 30% Hydrogen peroxide (50) | Phosphoric acid (20) Deionized water (80) | 70 | B | B |
| 105 (This invention) | Ammonium carbonate (10) Deionized water (15) Ethylene carbonate (75) 30% Hydrogen peroxide (50) | Glycolic acid (20) Deionized water (80) | 70 | B | B |
| 106 (This invention) | Ammonium carbonate (10) Deionized water (15) Ethylene carbonate (75) 30% Hydrogen peroxide (50) | Malic acid (20) Deionized water (80) | 70 | B | B |
| 107 (This invention) | Ammonium carbonate (10) Deionized water (15) Ethylene carbonate (75) 30% Hydrogen peroxide (50) | Tartaric acid (20) Deionized water (80) | 70 | B | B |

| Test No. | Al$_2$O$_3$ ER (Å/min) | TiN ER (Å/min) | HfO$_2$ ER (Å min) | SiGe 40% ER (Å min) | Doped Si-Loss (Å) | Ox growth (Å) |
|---|---|---|---|---|---|---|
| S11 (Reference Example) | 50 | 20 | <1 | 10 | <0.1 | 15 |
| 101 (This invention) | 35 | 14 | <1 | 7 | <0.1 | 9 |
| 102 (This invention) | 32 | 15 | <1 | 7 | <0.1 | 10 |
| 103 (This invention) | 36 | 14 | <1 | 6 | <0.1 | 10 |
| 104 (This invention) | 35 | 15 | <1 | 7 | <0.1 | 10 |

TABLE 1-continued

| Test No. | Al₂O₃ ER (Å/min) | TiN ER (Å/min) | HfO₂ ER (Å/min) | SiGe 40% ER (Å/min) | Doped Si-Loss (Å) | Ox growth (Å) |
|---|---|---|---|---|---|---|
| 105 (This invention) | 34 | 15 | <1 | 7 | <0.1 | 10 |
| 106 (This invention) | 34 | 14 | <1 | 7 | <0.1 | 10 |
| 107 (This invention) | 34 | 15 | <1 | 7 | <0.1 | 10 |

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| 108 (This invention) | Ammonium carbonate (10) Deionized water (15) Ethylene carbonate (75) 30% Hydrogen peroxide (50) | lactic acid (20) Deionized water (80) | 70 | B | B |
| 109 (This invention) | Ammonium carbonate (10) Deionized water (15) Ethylene carbonate (75) 30% Hydrogen peroxide (50) | Taurine (20) Deionized water (80) | 70 | B | B |
| 110 (This invention) | Ammonium carbonate (10) Deionized water (15) Ethylene carbonate (75) 30% Hydrogen peroxide (50) | Aspartic acid (20) Deionized water (80) | 70 | B | B |
| 111 (This invention) | Ammonium carbonate (10) Deionized water (15) Ethylene carbonate (75) 30% Hydrogen peroxide (50) | Toluenesulfonic acid (20) Deionized water (80) | 70 | B | B |
| 112 (This invention) | Ammonium carbonate (10) Deionized water (15) Ethylene carbonate (75) 30% Hydrogen peroxide (50) | Sulfamic acid (20) Deionized water (80) | 70 | B | B |

| Test No. | Al₂O₃ ER (Å/min) | TiN ER (Å/min) | HfO₂ ER (Å/min) | SiGe 40% ER (Å/min) | Doped Si-Loss (Å) | Ox growth (Å) |
|---|---|---|---|---|---|---|
| 108 (This invention) | 34 | 15 | <1 | 6 | <0.1 | 10 |
| 109 (This invention) | 34 | 16 | <1 | 7 | <0.1 | 9 |
| 110 (This invention) | 34 | 15 | <1 | 7 | <0.1 | 10 |
| 111 (This invention) | 34 | 15 | <1 | 7 | <0.1 | 10 |
| 112 (This invention) | 34 | 15 | <1 | 8 | <0.1 | 10 |

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| C11 (Comparative Example) (SPM) | 30% Hydrogen peroxide (100) | 98% Sulfuric acid (100) | 70 | A | AAA |
| C12 (Comparative Example) (SPM) | Ammonium carbonate (10) Deionized water (15) Ethylene carbonate (75) 30% Hydrogen peroxide (50) | | 70 | B | C |
| C13 (Comparative Example) | | Citric acid (20) Deionized water (80) | 70 | C | C |
| C14 (Comparative Example) | Ammonium carbonate (10) Deionized water (15) 30% Hydrogen peroxide (50) | Citric acid (20) Deionized water (80) | 70 | C | C |

| Test No. | Al₂O₃ ER (Å/min) | TiN ER (Å/min) | HfO₂ ER (Å/min) | SiGe 40% ER (Å/min) | Doped Si-Loss (Å) | Ox growth (Å) |
|---|---|---|---|---|---|---|
| C11 (Comparative Example) (SPM) | 480 | 30 | 8 | 30 | 10 | 50 |
| C12 (Comparative Example) (SPM) | No evaluation was conducted. | | | | | |
| C13 (Comparative Example) | No evaluation was conducted. | | | | | |
| C14 (Comparative Example) | No evaluation was conducted. | | | | | |

TABLE 2

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| 101 (This invention) | Ammonium carbonate (10) Deionized water (15) Ethylene carbonate (75) 30% Hydrogen peroxide (50) | Citric acid (20) Deionized water (80) | 70 | B | B |
| 201 (This invention) | Potassium carbonate (10) Deionized water (15) Ethylene carbonate (75) 30% Hydrogen peroxide (50) | Citric acid (20) Deionized water (80) | 70 | B | B |
| 202 (This invention) | Guanidine carbonate (10) Deionized water (15) Ethylene carbonate (75) 30% Hydrogen peroxide (50) | Citric acid (20) Deionized water (80) | 70 | B | B |

| Test No. | $Al_2O_3$ ER (Å/min) | TiN ER (Å/min) | $HfO_2$ ER (Å min) | SiGe 40% ER (Å min) | Doped Si-Loss (Å) | Ox growth (Å) |
|---|---|---|---|---|---|---|
| 101 (This invention) | 35 | 14 | <1 | 7 | <0.1 | 9 |
| 201 (This invention) | 36 | 15 | <1 | 8 | <0.1 | 9 |
| 202 (This invention) | 35 | 15 | <1 | 7 | <0.1 | 10 |

TABLE 3

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| 101 (This invention) | Ammonium carbonate (10) Deionized water (15) Ethylene carbonate (75) 30% Hydrogen peroxide (50) | Citric acid (20) Deionized water (80) | 70 | B | B |
| 301 (This invention) | Ammonium carbonate (20) Deionized water (30) Ethylene carbonate (50) 30% Hydrogen peroxide (50) | Citric acid (20) Deionized water (80) | 70 | B | B better than 101 |
| 302 (This invention) | Ammonium carbonate (5) Deionized water (15) Ethylene carbonate (80) 30% Hydrogen peroxide (50) | Citric acid (20) Deionized water (80) | 70 | B | B worse than 101 |

| Test No. | $Al_2O_3$ ER (Å/min) | TiN ER (Å/min) | $HfO_2$ ER (Å min) | SiGe 40% ER (Å min) | Doped Si-Loss (Å) | Ox growth (Å) |
|---|---|---|---|---|---|---|
| 101 (This invention) | 35 | 14 | <1 | 7 | <0.1 | 9 |
| 301 (This invention) | 36 | 14 | <1 | 7 | <0.1 | 10 |
| 302 (This invention) | 35 | 14 | <1 | 7 | <0.1 | 8 |

TABLE 4

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| 101 (This invention) | Ammonium carbonate (10) Deionized water (15) Ethylene carbonate (75) 30% Hydrogen peroxide (50) | Citric acid (20) Deionized water (80) | 70 | B | B |
| 401 (This invention) | Ammonium carbonate (10) Deionized water (30) Ethylene carbonate (60) 30% Hydrogen peroxide (50) | Citric acid (20) Deionized water (80) | 70 | B worse than 101 | B |
| 402 (This invention) | Ammonium carbonate (10) Deionized water (60) Ethylene carbonate (20) 30% Hydrogen peroxide (50) | Citric acid (20) Deionized water (80) | 70 | B' | B |

TABLE 4-continued

| Test No. | Al$_2$O$_3$ ER (Å/min) | TiN ER (Å/min) | HfO$_2$ ER (Å min) | SiGe 40% ER (Å min) | Doped Si-Loss (Å) | Ox growth (Å) |
|---|---|---|---|---|---|---|
| 101 (This invention) | 35 | 14 | <1 | 7 | <0.1 | 9 |
| 401 (This invention) | 38 | 15 | <1 | 7 | <0.1 | 10 |
| 402 (This invention) | 40 | 17 | <1 | 8 | <0.1 | 12 |

TABLE 5

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| 101 (This invention) | Ammonium carbonate (10) Deionized water (15) Ethylene carbonate (75) 30% Hydrogen peroxide (50) | Citric acid (20) Deionized water (80) | 70 | B | B |
| 501 (This invention) | Ammonium carbonate (10) Deionized water (15) Ethylene carbonate (75) 30% Hydrogen peroxide (50) | Citric acid (40) Deionized water (60) | 70 | B | B |

| Test No. | Al$_2$O$_3$ ER (Å/min) | TiN ER (Å/min) | HfO$_2$ ER (Å min) | SiGe 40% ER (Å min) | Doped Si-Loss (Å) | Ox growth (Å) |
|---|---|---|---|---|---|---|
| 101 (This invention) | 35 | 14 | <1 | 7 | <0.1 | 9 |
| 501 (This invention) | 34 | 15 | <1 | 7 | <0.1 | 9 |

TABLE 6

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| 101 (This invention) | Ammonium carbonate (10) Deionized water (15) Ethylene carbonate (75) 30% Hydrogen peroxide (50) | Citric acid (20) Deionized water (80) | 70 | B | B |
| 601 (This invention) | Ammonium carbonate (10) Deionized water (15) Ethylene carbonate (75) 30% Hydrogen peroxide (10) | Citric acid (20) Deionized water (80) | 70 | B | B' |
| 602 (This invention) | Ammonium carbonate (10) Deionized water (15) Ethylene carbonate (75) 30% Hydrogen peroxide (100) | Citric acid (20) Deionized water (80) | 70 | B' | B better than 101 |

| Test No. | Al$_2$O$_3$ ER (Å/min) | TiN ER (Å/min) | HfO$_2$ ER (Å min) | SiGe 40% ER (Å min) | Doped Si-Loss (Å) | Ox growth (Å) |
|---|---|---|---|---|---|---|
| 101 (This invention) | 35 | 14 | <1 | 7 | <0.1 | 9 |
| 601 (This invention) | 35 | 14 | <1 | 7 | <0.1 | 8 |
| 602 (This invention) | 38 | 16 | <1 | 9 | <0.1 | 11 |

TABLE 7

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| 101 (This invention) | Ammonium carbonate (10) Deionized water (15) Ethylene carbonate (75) 30% Hydrogen peroxide (50) | Citric acid (20) Deionized water (80) | 70 | B | B |

TABLE 7-continued

| Test No. | | | | | |
|---|---|---|---|---|---|
| 701 (This invention) | Ammonium carbonate (20) Deionized water (30) Ethylene carbonate (50) Surfactant W1 (1) 30% Hydrogen peroxide (50) | Citric acid (20) Deionized water (80) | 70 | A | B |
| 702 (This invention) | Ammonium carbonate (20) Deionized water (30) Ethylene carbonate (50) Surfactant W1 (3) 30% Hydrogen peroxide (50) | Citric acid (20) Deionized water (80) | 70 | A | B |
| 703 (This invention) | Ammonium carbonate (20) Deionized water (30) Ethylene carbonate (50) Surfactant W2(1) 30% Hydrogen peroxide (50) | Citric acid (20) Deionized water (80) | 70 | A | B |
| 704 (This invention) | Ammonium carbonate (20) Deionized water (30) Ethylene carbonate (50) Surfactant W3 (1) 30% Hydrogen peroxide (50) | Citric acid (20) Deionized water (80) | 70 | A | B |
| 705 (This invention) | Ammonium carbonate (20) Deionized water (30) Ethylene carbonate (50) Sodium dodecylbenzene sulfonate (1) 30% Hydrogen peroxide (50) | Citric acid (20) Deionized water (80) | 70 | B | B |

| Test No. | $Al_2O_3$ ER (Å/min) | TiN ER (Å/min) | $HfO_2$ ER (Å min) | SiGe 40% ER (Å min) | Doped Si-Loss (Å) | Ox growth (Å) |
|---|---|---|---|---|---|---|
| 101 (This invention) | 35 | 14 | <1 | 7 | <0.1 | 9 |
| 701 (This invention) | 31 | 12 | <1 | 6 | <0.1 | 6 |
| 702 (This invention) | 30 | 10 | <1 | 5 | <0.1 | 7 |
| 703 (This invention) | 30 | 12 | <1 | 6 | <0.1 | 7 |
| 704 (This invention) | 33 | 12 | <1 | 6 | <0.1 | 6 |
| 705 (This invention) | 32 | 12 | <1 | 6 | <0.1 | 7 |

TABLE 8

| Test No. | Foaming agent component (g) | Foaming aid component (g) | Treatment temperature (° C.) | Detachability of resist (bulk layer removal) | Detachability of resist (hardened layer removal) |
|---|---|---|---|---|---|
| 101 (This invention) | Ammonium carbonate (10) Deionized water (15) Ethylene carbonate (75) 30% Hydrogen peroxide (50) | Citric acid (20) Deionized water (80) | 70 | B | B |
| 801 (This invention) | Ammonium carbonate (20) Deionized water (30) Ethylene carbonate (50) Acetylcholine (5) 30% Hydrogen peroxide (50) | Citric acid (20) Deionized water (80) | 70 | B | A |
| 802 (This invention) | Ammonium carbonate (20) Deionized water (30) Ethylene carbonate (50) Acetylcholine (10) 30% Hydrogen peroxide (50) | Citric acid (20) Deionized water (80) | 70 | B | A better than 801 |
| 803 (This invention) | Ammonium carbonate (20) Deionized water (30) Ethylene carbonate (50) N-Acetyl-L-cysteine (5) 30% Hydrogen peroxide (50) | Citric acid (20) Deionized water (80) | 70 | B | A |
| 804 (This invention) | Ammonium carbonate (20) Deionized water (30) Ethylene carbonate (50) N-Acetylglycine (5) Surfactant W2(1) 30% Hydrogen peroxide (50) | Citric acid (20) Deionized water (80) | 70 | B | A |
| 805 (This invention) | Ammonium carbonate (20) Deionized water (30) Ethylene carbonate (50) Surfactant W1 (1) | Citric acid (20) Deionized water (80) | 70 | A | A |

TABLE 8-continued

Acetylcholine (5)
30% Hydrogen peroxide (50)

| Test No. | Al$_2$O$_3$ ER (Å/min) | TiN ER (Å/min) | HfO$_2$ ER (Å min) | SiGe 40% ER (Å min) | Doped Si-Loss (Å) | Ox growth (Å) |
|---|---|---|---|---|---|---|
| 101 (This invention) | 35 | 14 | <1 | 7 | <0.1 | 9 |
| 801 (This invention) | 36 | 14 | <1 | 7 | <0.1 | 9 |
| 802 (This invention) | 36 | 14 | <1 | 8 | <0.1 | 9 |
| 803 (This invention) | 35 | 15 | <1 | 7 | <0.1 | 10 |
| 804 (This invention) | 32 | 14 | <1 | 7 | <0.1 | 9 |
| 805 (This invention) | 30 | 10 | <1 | 6 | <0.1 | 5 |

As can be seen from the results described above, conventional SPM cleaning showed satisfactory results in the hardened layer removal, but did not show any particularly conspicuous differences in the bulk layer removal. Particularly, the damage to the substrate was severe, and considering the high level of requirements of recent years, the damage was to the extent that would cause a problem in practical use. On the contrary, it was found that the cleaning agent for semiconductor substrates of the present invention (Examples) exhibit a cleaning power sufficiently conforming to the requirements for practical use, and show an improvement to a large extent in terms of the damage of semiconductor substrates by SPM cleaning agents, with respect to various constituent materials.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2010-241082 filed in Japan on Oct. 27, 2010, which is entirely herein incorporated by reference.

I claim:

1. A multi-agent type cleaning kit for applying to semiconductor substrates, comprising:
   a foaming agent having an alkylene carbonate and a carbonic acid salt;
   a foaming aid having an acidic compound; and
   an oxidizing agent;
   at least the foaming agent being mixed with the foaming aid upon using for the cleaning of a semiconductor substrate, in combination with the oxidizing agent.

2. The multi-agent type cleaning kit according to claim 1, wherein the alkylene carbonate and/or the carbonic acid salt of the foaming agent is brought into reaction with the acidic compound of the foaming aid, by mixing the foaming agent and the foaming aid, so as to produce carbon dioxide gas for foaming.

3. The multi-agent type cleaning kit according to claim 1, further comprising a surfactant.

4. The multi-agent type cleaning kit according to claim 1, wherein ethylene carbonate or propylene carbonate is used as the alkylene carbonate.

5. The multi-agent type cleaning kit according to claim 1, wherein the surfactant is a nonionic surfactant.

6. The multi-agent type cleaning kit according to claim 1, wherein the carbonic acid salt is a carbonic acid salt selected from the group consisting of ammonium carbonate, ammonium hydrogen carbonate, sodium hydrogen carbonate, sodium carbonate, potassium carbonate, potassium hydrogen carbonate, cesium carbonate, lanthanum carbonate, lithium carbonate, magnesium carbonate, manganese carbonate, nickel carbonate, strontium carbonate, aminoguanidine carbonate, and guanidine carbonate.

7. The multi-agent type cleaning kit according to claim 1, wherein a concentration of the carbonic acid salt is 0.1% to 30% by mass relative to the total amount of the cleaning agent for semiconductor substrates obtained after mixing.

8. The multi-agent type cleaning kit according to claim 1, wherein the acidic compound is a compound selected from the group consisting of sulfuric acid, nitric acid, boric acid, phosphoric acid, formic acid, acetic acid, propionic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, glycine, alanine, aspartic acid, glutamic acid, aminomethanesulfonic acid, taurine, benzenesulfonic acid, toluenesulfonic acid, methanesulfonic acid, ethanesulfonic acid, and sulfamic acid.

9. The multi-agent type cleaning kit according to claim 1, wherein the oxidizing agent is a compound selected from the group consisting of hydrogen peroxide, nitrates, persulfates, bichromates, and permanganates.

10. A method of cleaning a semiconductor substrate using a multi-agent type cleaning kit, comprising the steps of:
    preparing a multi-agent type cleaning kit including at least a foaming agent and a foaming aid, the foaming agent having an alkylene carbonate and a carbonic acid salt, the foaming aid having an acidic compound;
    providing an oxidizing agent to be contained at least in one of the foaming agent and the foaming aid; and
    mixing the foaming agent and the foaming aid so as to produce carbon dioxide gas for foaming.

11. A method of cleaning a semiconductor substrate using a multi-agent type cleaning kit, comprising the steps of:
    preparing a multi-agent type cleaning kit including:
    a foaming agent having an alkylene carbonate and a carbonic acid salt,
    a foaming aid having an acidic compound, and
    an agent containing an oxidizing agent,
    mixing the foaming agent, the foaming aid, and the agent containing the oxidizing agent, so as to produce carbon dioxide gas for foaming.

12. A method of producing a semiconductor element, the method comprising use of the cleaning method according to claim 10 in the production of a semiconductor element.

13. A method of producing a semiconductor element, the method comprising use of the cleaning method according to claim 11 in the production of a semiconductor element.

\* \* \* \* \*